United States Patent [19]
Faugeras et al.

[11] Patent Number: 4,656,350
[45] Date of Patent: Apr. 7, 1987

[54] OPTO-ELECTRONIC SELECTOR HAVING A PLURALITY OF OPTICAL SIGNAL INLETS

[75] Inventors: Philippe Faugeras, Boulogne Billancourt; Daniel Tribet, Epinay sur Orge, both of France

[73] Assignee: Compagnie Industrielle Des Telecommunications CIT-Alcatel, France

[21] Appl. No.: 744,356

[22] Filed: Jun. 13, 1985

[30] Foreign Application Priority Data

Jun. 15, 1984 [FR] France .................................. 84 09414

[51] Int. Cl.⁴ ............................................. H01J 40/14
[52] U.S. Cl. ....................................... 250/209; 250/578
[58] Field of Search ............... 250/208, 209, 206, 214, 250/578; 357/31, 32; 358/213

[56] References Cited

U.S. PATENT DOCUMENTS 4,592,029 5/1986 Altmann et al. .................... 250/578

FOREIGN PATENT DOCUMENTS 2055196 11/1978 United Kingdom .

OTHER PUBLICATIONS

Optical Communication, 9th European Conference on Optical Communication, 23–26 Oct. 1983, pp. 331–334, P. B. Hesdahl et al., "A Multi Service Single Fibre Subscriber Network with Wideband Electro-Optical Switching".

Primary Examiner—David C. Nelms
Assistant Examiner—S. Allen
Attorney, Agent, or Firm—Sughrue, Mion, Zinn, Macpeak and Seas

[57] ABSTRACT

An opto-electronic selector having matrix-addressed photodetectors is characterized in that the photodetectors (Ph) are followed by individual amplifiers (PA), each of which is powered at constant voltage by a voltage source under the control of a matrix line selection control (X) and at constant current from a current source proper to said amplifier and capable of being switched on under the control of a matrix column selection (Y), thereby forming a switching cell (C) in conjunction with the associated photodetector. Such a detector may be used in broadcasting programs to subscribers.

4 Claims, 2 Drawing Figures

OPTO-ELECTRONIC SELECTOR HAVING A PLURALITY OF OPTICAL SIGNAL INLETS

The present invention relates to optical transmission. Its subject matter is an opto-electronic selector, of the type having P inlets for P different optical signals and one outlet for an electrical signal corresponding to a desired one of the P inlet optical signals. Such opto-electronic selectors are applicable in particular in equipment for broadcasting P programs to N subscribers to enable each of these N subscribers to receive a desired one of the programs.

BACKGROUND OF THE INVENTION

Generally, equipment for optically broadcasting P programs to N subscribers performs two functions: one of which is a distribution function which consists in transmitting each of the programs N times for N subscribers; and the other of which is a selection function which consists in transmitting over each of N subscriber links only that one of the programs which is desired by the subscriber concerned, selected from the P programs made available. In one such broadcast equipment, the function of distributing the P programs to the N subscribers may be performed by wave guides, such as optical fibers or guides which are integrated into a medium, or they may be provided by optical systems such as lenses. The selection function for selecting one out of P programs by each subscriber may be provided in particular by photodiodes.

The article entitled "A high-speed opto-electronic matrix using heterojunction switching photodiodes" by H. Hara et al, published in the IEEE Journal of Quantum Electronics, vol. QE-17 No. 8, August 1981, pages 1539 to 1545 describes the principle of providing an opto-electronic switching matrix based on photodiodes with reference to FIG. 1 provided therein. In this example, the individual power supply to each photodiode is used to provide switching, said power supply takes place via a controlled switch associated with the photodiode for obtaining the function of selecting one inlet signal from a plurality at the outlet from the matrix. Thus, when one of the photodiodes is connected to the positive power supply terminal, this photodiode converts the received optical signal or received photons into an electrical current which is detected and transmitted over the outlet which is common to a column of photodiodes. However, when one of the photodiodes is connected to the negative power supply terminal, this photodiode is DC biased and has an electric current passing therethrough of about 10 mA, thus preventing any detection of a received optical signal. The passage of such a current is necessary in order to cancel the photovoltaic effect of the photodiode.

The article entitled "A multiservice single fiber subscriber network with wide band electro-optical switching" by P. B. Hesdahl et al appearing in ECOC 83—9th European Conference on Optical Communication and published by Elsevier Science Publishers P.V. (North Holland), 1983 page 331 to 334 also describes the principle of making an opto-electronic selection matrix from photodiodes each of which is followed by an associated preamplifier. In this matrix, individual switching control of the photodiodes is applied both to the power supply to each photodiode and to the power supply to the associated preamplifier. This configuration, as in the preceding matrix configuration, uses discrete components and provides point decoding of signals transmitted to intersection points; in addition, relative to the preceding matrix, this matrix provides improved isolation between photodiodes and avoids the components consuming electricity when the desired received signal is not detected.

An opto-electronic selector having photodiodes associated with switching transistors for addressing them in matrix form is also known from French Pat. Nos. 2441309 and 2445678, in particular. In such an arrangement, the photodiodes are identified by the intersections of lines and columns. The photodiodes individually receive the inlet optical signals to the selector, and their electrical signal outlets are connected in common to the outlet from the selector. All of the photodiodes are biased from a common voltage source. Bias is applied to each photodiode under the control of two MOS transistors connected in series. One of these transistors is attributed to all the photodiodes of a given line and is switched on by applying a voltage to its gate in response to a command selecting the line corresponding to the photodiode in question. The other transistor is attributed to a single photodiode and is switched on by a voltage being applied to its gate under the control of a column selection suitable for said photodiode, said column selection control voltage being applied in common to the gates of all of the transistors attributed to the photodiodes in said column. When the photodetector selected in this manner receives a light signal, current is transmitted to its electrical signal outlet. In such a selector, it is essentiaal that the non-selected photodiodes are unable to dispose of the charges which are created when they receive an optical signal. This implies that the transistors attributed to the unaffected columns and also those attributed to the unaffected lines should be effectively turned off, i.e. they should have zero or very low leakage current in order not to transmit interference currents from the non-selected photodiodes. As a consequence, although this solution is of interest for reducing the number of control links by using a matrix addressing system for the photodiodes, it nevertheless remains difficult to implement in practice, in particular in face of the difficulty in obtaining high-quality photodiodes (sensitivity of about 0.4 A/W and operating capacitance of less than 0.3 pF) on the same substrate as MOS transistors having an on/off resistance ratio of $10^7$.

The aim of the present invention is thus to provide an opto-electronic selector of the type in which the photodetectors are matrix addressed, but further presenting increased insensitivity to noise and better isolation between channels than the above-mentioned known structure of this type, and also being readily suitable for integration.

SUMMARY OF THE INVENTION

The invention thus provides an opto-electronic selector having matrix-addressed photodetectors in which the individual optical signal inlets to the photodetectors constitute the individual optical signal inlets to the selector and the individual electrical signal outlets from the photodetectors are connected in common to an electrical signal outlet from the selector, characterized by the fact that the said photodetectors are followed by individual amplifiers each of which is powered at constant voltage by a voltage source by means of a matrix line selector and at constant current by a current source proper to the said amplifier under consideration and capable of being switched on by means of a matrix column selector, the amplification stages of said amplifiers being of differential structure.

BRIEF DESCRIPTION OF THE DRAWINGS

An embodiment of the invention is described by way of example with reference to the accompanying drawings.

MORE DETAILED DESCRIPTION

Figure 1:
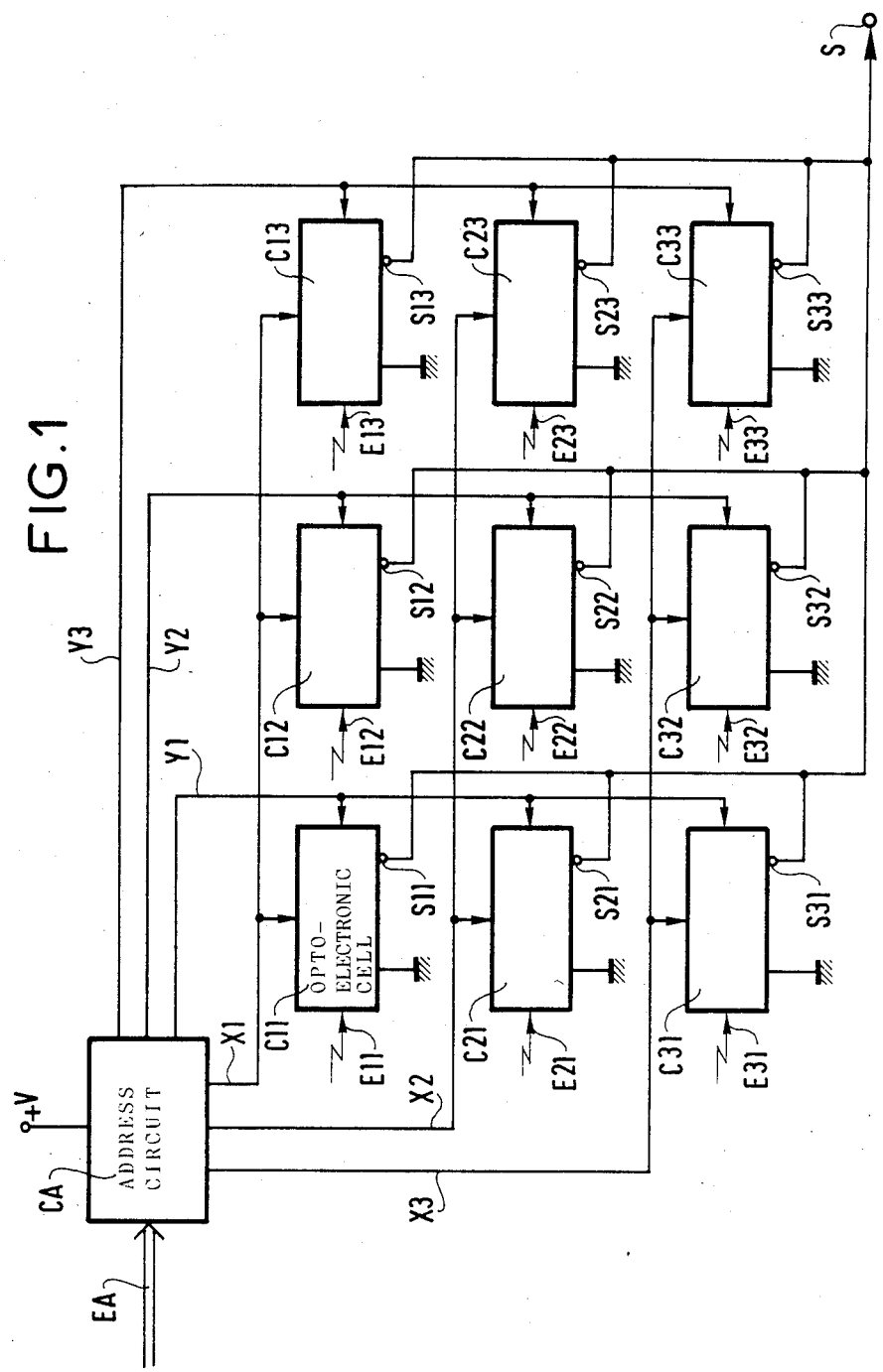
FIG. 1 is a block diagram showing an opto-electronic selector having matrix addressing of the type covered by the present invention.

FIG. 1 shows a matrix-addressed opto-electronic selector having P optical signal inlets and a single electrical signal outlet. In the example shown there are 9 optical signal inlets referenced E11, E12, E13, E21, ... , E33, and the electrical signal outlet is referenced S. The selector comprises 9 opto-electronic cells arranged in a 3×3 matrix arrangement and referenced C11, C12. C13, C21, ..., C33. Each cell includes a photodetector (not shown) whose optical signal inlet constitutes one of the inlets E11 to E33 to the selector. Each opto-electronic cell has an electrical signal outlet referenced s11, s12, s13, s21, ..., s33, depending on the cell in question, which is directly connected to the common outlet S of the selector. Each cell is additionally connected to ground.

This opto-electronic selector uses matrix addressing. To this end, it includes two networks of addressing links X1, X2 and X3 for line addressing links and Y1, Y2 and Y3 for column addressing links. These links are connected to the cells depending on the rank of the line and the columns to which each cell is attributed, and they are also connected to a line selector circuit and a column selector circuit or addressing circuit CA. The circuit CA is connected to an external voltage source +V and receives a control signal on an addressing control inlet EA for selecting one of the cells, and on the basis of said signal it applies the voltage +V to said cell simultaneously via the line and the column to which said cell belongs.

Naturally, any other matrix disposition of cells could be adopted without modifying the principle whereby one of the cells from the set of cells is selected.

Figure 2:
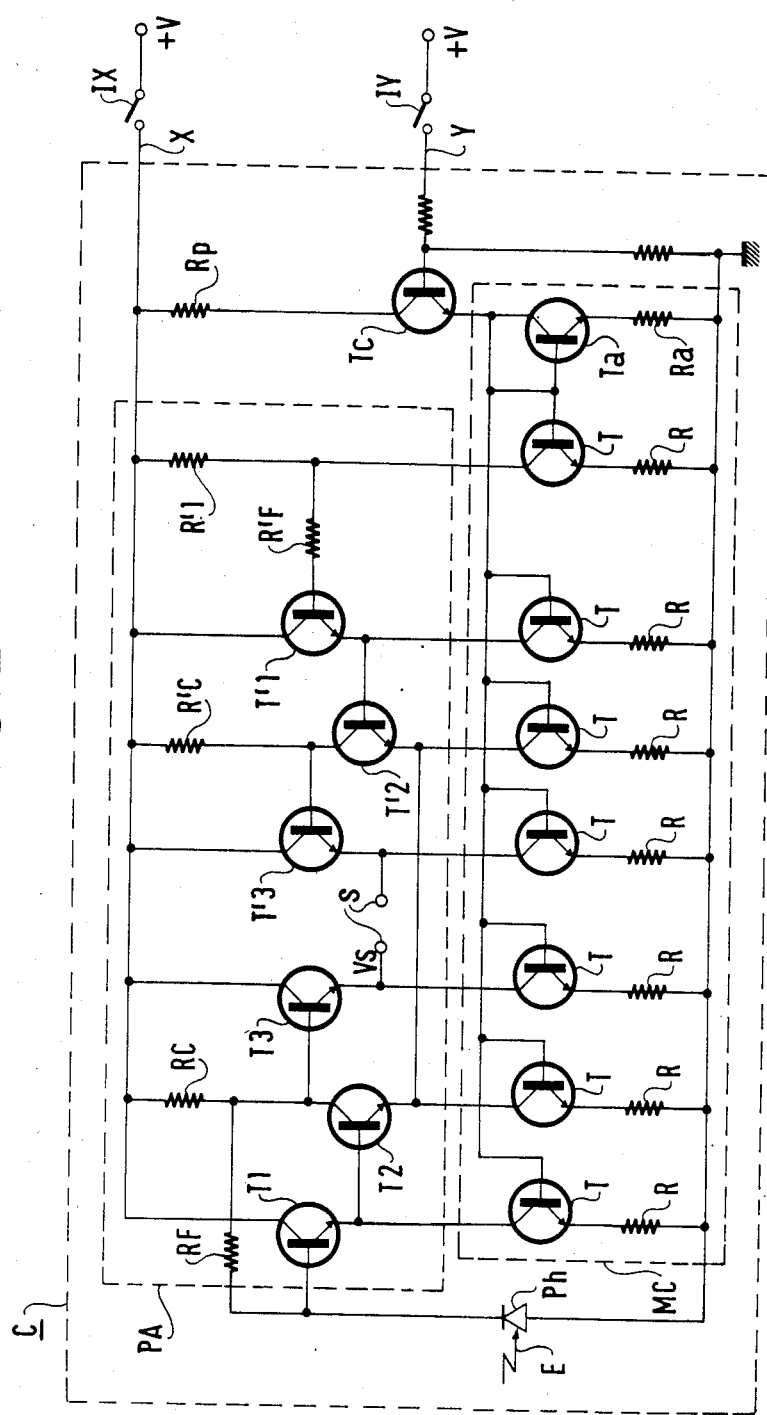
FIG. 2 is an electrical circuit for a single optoelectronic cell in accordance with the invention, constituting a part of the opto-electronic selector of FIG. 1 at an intersection point in the matrix.

FIG. 2 is an electrical circuit diagram for any one of the opto-electronic cells in accordance with the invention and referenced C, as used in the FIG. 1 selector as a unit component of the selector. This component is about (500×500) $\mu m^2$ for a photodiode having a sensitive area of (200×200) $\mu m^2$.

The cell C is essentially constituted by a photodetector Ph followed by a preamplifier PA and a current mirror MC used for supplying power to the preamplifier from the line addressing link X and the column addressing link Y which corresponds to said cell C in the FIG. 1 circuit.

It may be observed that in the illustrated circuit for said cell, all of the transistors which appear are, by way of example, of the NPN type.

The photodiode Ph is connected to ground and via resistances RF and RC to the line addressing link X for biasing purposes.

The preamplifier PA is symmetrical in structure and comprises three stages: an inlet stage, an intermediate/amplifying stage of differential structure, and an outlet stage. Each stage is connected to be powered between the line addressing link X and two branches of the current mirror MC under the control of the link Y.

The inlet stage is constituted by two common collector connected transistors T1 and T'1. The base of the transistor T1 is connected to the common connection point between the photodiode pH and the resistance RF, the collector is connected to the link X and the emitter is connected to one of the branches of the current mirror. The transistor T'1 has its emitter connected to its own branch of the current mirror, its base is connected via a resistance R'F firstly via a resistance R'1 to the link X and secondly to another branch of the current mirror so as to provide biasing which is as identical as possible to the bias applied to the transistor T1. This inlet stage serves to reduce high frequency noise.

The intermediate state is constituted by two amplifying transistors T2 and T'2 which are common emitter connected and which form a differential pair. The emitters of these transistors T2 and T'2 are connected via a common link to two branches of the current mirror attributed to the intermediate stage, the base of each of these transistors is connected to the emitter of the corresponding inlet stage transistor T1 or T'1. The collector of the transistor T2 is connected to the common connection point between the resistances RC and RF, the resistance RF connecting it to the photodiode Ph thus being connected in negative feedback around the transistor T2 to constitute a transimpedance type amplifier circuit. The collector of transistor T'2 is connected to the link X via a resistance R'C.

The outlet stage is constituted by two transistors T3 and T'3 which are common collector connected. Each of these transistors has its base connected to the collector of the transistor T2 or T'2 of the corresponding amplification stage. The emitters of these transistors are connected to their own current mirror branches and together they define a two-wire link corresponding to the outlet s from said cell, which outlet is connected to the outlet S of the selector as shown in FIG. 1. The outlet stage serves to provide low inlet impedance, and thus provides good matching of the cell C to the following circuits in the signal transmission link then established to the corresponding subscriber from the outlet S of the selector.

The current mirror MC has one control branch and seven controlled branches. The controlled branches are identical to one another and each comprises a transistor T whose collector-emitter connection is connected in series with the collector-emitter connection of the preamplifier transistor to which the branch is attributed (in the case of six of them) and with the resistance R'1 for the seventh, and also in series with a resistance R connected to ground. The control branch comprises a transistor Ta whose emitter is connected to ground via a resistance Ra and whose collector is connected to the base of said transistor Ta and also to the bases of all the transistors T. The collector is also connected to the emitter of a switching transistor Tc whose collector is connected to the line addressing link X via a bias resistance Rp and whose base is connected via a voltage dividing resistor bridge to the column addressing link Y and to ground.

In the FIG. 2 circuit, the presence or absence of a bias voltage and a control voltage on the X and Y links has been represented diagrammatically by the closed or open condition of respective switches IX and IY connecting the link X to the voltage source +V and the link Y to the voltage source +V.

In operation, the general supply voltage +V is transmitted via the link X to the cell C (switch IX closed) and the photodiode Ph is biased by the resistances RC and RF. When the control signal (which is also at +V) is absent from the link Y (switch IY open) the transistor Tc is off, and no current flows through the transistors Tc and Ta or the transistors T of the various controlled branches of the current mirror MC. Under these conditions, the transistors T1, T2 and T3, and T'1, T'2, and T'3 are unpowered and no current passes through the preamplifier. Thus, although the photodiode is biased no signal can appear at the outlet from the cell. The current consumed by the cell is thus limited to the leakage currents of the transistors and the photodiode (about one nanoamp).

When the power supply voltage +V is simultaneously present on the link X (switch IY closed) and the link Y (switch IY), the photodiode Ph is biased and, since the transistor Tc is on, the various branches of the current mirror MC are activated. Current then flows through the various stages of the preamplifier which delivers an output signal Vs representative of the optical signal received by the sensitive area of the selected photodiode.

If the link X is not powered, no information can be transmitted to the outlet s of the cell and the cell does not consume energy.

The structure of the cells is suitable for making an opto-electronic selector with matrix addressing which is highly insensitive to noise, which has excellent isolation between the individual outlets from the cells, and whose energy consumption is substantially limited to the consumption of the sole cell to be selected. Further, this selector may be made from photodiodes and bipolar transistors, and is thus suitable for integration.

We claim:

1. An opto-electronic selector having a plurality of optical signal inlets and an electrical signal outlet, said selector comprising:
   matrix-addressed photodetectors having individual optical signal inlets which constitute respective optical signal inlets to the selector and individual electrical signal outlets connected in common to the electrical signal outlet from the selector; and
   a plurality of individual amplifiers having differential amplification stages following said photodetectors, each of said amplifiers being powered at a constant voltage from a voltage source by means of a matrix line selector, and at constant current from a current source proper to each said amplifier and switched on by means of a matrix column selector.

2. An opto-electronic selector according to claim 1, wherein each photodetector is biassed from said voltage source by means of a resistor connected as a negative feedback resistance in the amplifier following each photodetector.

3. An opto-electronic selector according to claim 1, wherein each current source comprises a current mirror having a plurality of individual branches, and each of said amplifiers has a plurality of stages powered by individual branches of the current mirror constituting the current source associated with each amplifier.

4. An opto-electronic selector according to claim 3, wherein the said current mirror of the current source associated with each amplifier is activated by a switching transistor which is biassed from said voltage source by means of the line selector and which is controlled by said voltage source by means of the column selector.

* * * * *